United States Patent
Song

(10) Patent No.: US 8,692,278 B2
(45) Date of Patent: Apr. 8, 2014

(54) LIGHT EMITTING DEVICE

(75) Inventor: Hyun Don Song, Seoul (KR)

(73) Assignee: LG Innotek Co., Ltd., Seoul (KR)

( * ) Notice: Subject to any disclaimer, the term of this patent is extended or adjusted under 35 U.S.C. 154(b) by 110 days.

(21) Appl. No.: 12/961,669

(22) Filed: Dec. 7, 2010

(65) Prior Publication Data

US 2011/0133241 A1 Jun. 9, 2011

(30) Foreign Application Priority Data

Dec. 8, 2009 (KR) ........................ 10-2009-0121120

(51) Int. Cl.
*H01L 33/00* (2010.01)

(52) U.S. Cl.
USPC .............. 257/99; 257/E33.001; 257/E33.063; 438/22

(58) Field of Classification Search
USPC ................ 257/99, E33.001, E33.063; 438/22
See application file for complete search history.

(56) References Cited

U.S. PATENT DOCUMENTS

2008/0303055 A1 12/2008 Seong
2009/0159920 A1* 6/2009 Kim et al. ........................ 257/99

FOREIGN PATENT DOCUMENTS

| KR | 10-0522844 A | 10/2005 |
|---|---|---|
| KR | 10-2007-0068549 A | 7/2007 |
| KR | 10-2009-0067305 A | 6/2009 |
| KR | 10-2009-0101604 A | 9/2009 |
| KR | 10-2009-0104453 A | 10/2009 |

OTHER PUBLICATIONS

Korean Patent [10-2009-1010604][machine's translation].*
Korean Patent [10-2004-0105455][machine's translation], Publication date Oct. 19, 2005.*
Korean Patent [10-2008-0061697][machines's translation], Publication date Jul. 3, 2008.*

* cited by examiner

*Primary Examiner* — Tony Tran
(74) *Attorney, Agent, or Firm* — Birch, Stewart, Kolasch & Birch, LLP

(57) ABSTRACT

Disclosed are a light emitting device, a light emitting device package, a lighting system and a manufacturing method of light emitting device. The light emitting device includes a light emitting structure including a first conductive semiconductor layer, a second conductive semiconductor layer, and an active layer between the first and second conductive semiconductor layers; a first ohmic layer over the light emitting structure; and a second ohmic layer including a pattern over the first ohmic layer.

13 Claims, 7 Drawing Sheets

LIGHT EMITTING DEVICE

CROSS-REFERENCE TO RELATED APPLICATION

This application claims priority under 35 U.S.C. §119 to Korean Patent Application No. 10-2009-0121120 filed Dec. 8, 2009 which is hereby incorporated by reference in its entirety.

BACKGROUND

The embodiment relates to a light emitting device, a light emitting device package, a lighting system, and a manufacturing method of light emitting device.

A light emitting device (LED) includes a p-n junction diode having a characteristic of converting electric energy into light energy. The p-n junction diode can be formed by combining group III-V elements of the periodic table. The LED can represent various colors by adjusting the compositional ratio of compound semiconductors.

When forward voltage is applied to the LED, electrons of an n layer are bonded with holes of a p layer, so that energy corresponding to an energy gap between a conduction band and a valance band may be generated. This energy is mainly realized as heat or light, and the LED emits the energy as the light.

A nitride semiconductor represents superior thermal stability and wide band gap energy so that the nitride semiconductor has been spotlighted in the field of optical devices and high-power electronic devices. In particular, blue, green, and UV light emitting devices employing the nitride semiconductor have already been developed and extensively used.

Recently, the semiconductor growth structure or the epitaxial growth process has been improved to develop a light emitting device having superior light extraction efficiency.

In order to improve the light extraction efficiency, a technology for patterning a transparent electrode has been suggested. However, when the transparent electrode is patterned, a light emitting structure may be damaged due to plasma impact, crystalline fracture occurs during the etching process for the transparent electrode and photoresist scum remains due to the micro patterning.

BRIEF SUMMARY

The embodiment provides a light emitting device, a light emitting device package, and a lighting system, in which a light extraction pattern is formed on an ohmic layer, so that failure factors, such as current leakage or increase of driving voltage, can be removed.

A light emitting device according to the embodiment includes a light emitting structure including a first conductive semiconductor layer, a second conductive semiconductor layer, and an active layer between the first and second conductive semiconductor layers; a first ohmic layer over the light emitting structure; and a second ohmic layer including a pattern over the first ohmic layer.

A method for manufacturing a light emitting device according to the embodiment includes forming a light emitting structure including a first conductive semiconductor layer, a second conductive semiconductor layer, and an active layer interposed between the first and second conductive semiconductor layers; forming a first ohmic layer on the light emitting structure; forming a second ohmic layer on the first ohmic layer; and forming a pattern in the second ohmic layer.

DETAILED DESCRIPTION OF THE EMBODIMENTS

Hereinafter, a light emitting device, a light emitting device package, and a lighting system according to the embodiments will be described in detail with reference to accompanying drawings.

In the description of embodiments, it will be understood that when a layer (or film) is referred to as being 'on' another layer or substrate, it can be directly on another layer or substrate, or intervening layers may also be present. Further, it will be understood that when a layer is referred to as being 'under' another layer, it can be directly under another layer, and one or more intervening layers may also be present. In addition, it will also be understood that when a layer is referred to as being 'between' two layers, it can be the only layer between the two layers, or one or more intervening layers may also be present.

Embodiments

Figure 1:
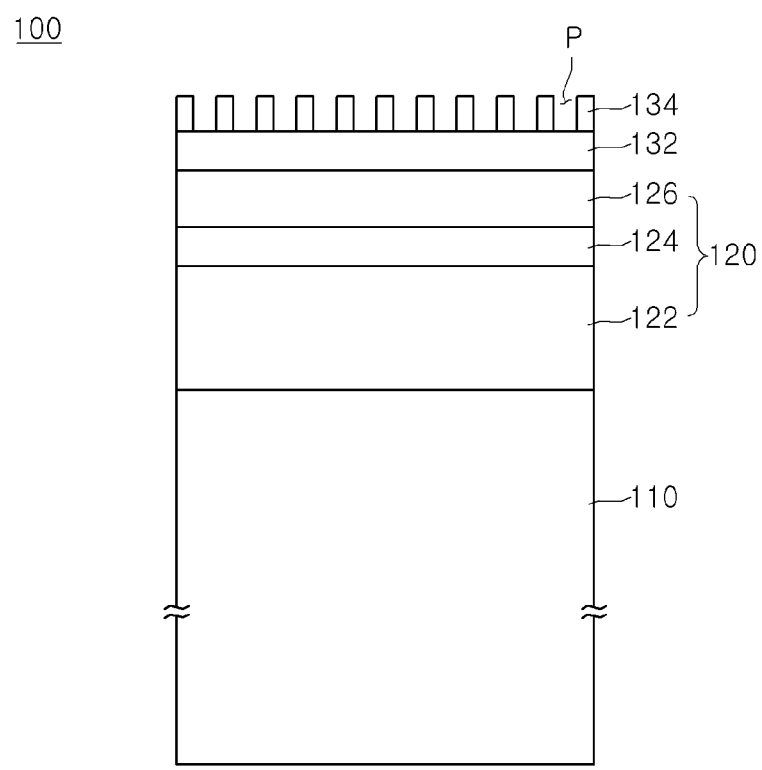
FIG. 1 is a sectional view showing a light emitting device according to the first embodiment.

FIG. 1 is a sectional view showing the light emitting device 100 according to the first embodiment.

The light emitting device 100 according to the first embodiment includes a light emitting structure 120 having a first conductive semiconductor layer 122, an active layer 124 and a second conductive semiconductor layer 126, a first ohmic layer 132 formed on the light emitting structure 210, and a second ohmic layer 134 formed on the first ohmic layer 132 and including a pattern P.

The light emitting structure 120 is formed on a nonconductive substrate 110 and the first ohmic layer 132 is formed on the second conductive semiconductor layer 126, so that the light emitting device may serve as a lateral type light emitting device, but the embodiment is not limited thereto.

The pattern P may include a photonic crystalline pattern, but the embodiment is not limited thereto. For instance, the pattern P may include a concave-convex pattern.

According to the embodiment, the pattern P has a periodic two-dimensional structure, such as a triangular lattice structure, a rectangular lattice structure, an Archimedean lattice structure or a quasi-crystal structure. In addition, the pattern P may have an irregular random pattern in addition to the periodic pattern.

According to the embodiment, the pattern P may include holes connected to each other for current diffusion.

The period of the pattern H according to the embodiment is about 100 nm to about 5000 nm and the filling factor, which is defined as an area ratio of the second ohmic layer 134 including the pattern P relative to the area of the top surface of the LED chip, is about 5% to about 95%.

The second ohmic layer 134 may have density lower than that of the first ohmic layer 132. Thus, binding energy between materials of the second ohmic layer 134 may be lower than binding energy between materials of the first ohmic layer 132.

According to the embodiment, crystalline property of the second ohmic layer 134 may be relatively lower than that of the first ohmic layer 132. For instance, the second ohmic layer 134 and the first ohmic layer 132 may have an amorphous structure, a polycrystalline structure or a single crystalline structure, but the embodiment is not limited thereto.

The first and second ohmic layers 132 and 134 can be formed by using the same material. For instance, the first and second ohmic layers 132 and 134 may include at least one of an oxide layer, a nitride layer, and a metal layer, but the embodiment is not limited thereto.

For instance, the first and second ohmic layers 132 and 134 may include at least one selected from the group consisting of ITO (indium tin oxide), IZO (indium zinc oxide), IZTO (indium zinc tin oxide), IAZO (indium aluminum zinc oxide), IGZO (indium gallium zinc oxide), IGTO (indium gallium tin oxide), AZO (aluminum zinc oxide), ATO (antimony tin oxide), GZO (gallium zinc oxide), IZON (IZO nitride), AGZO (Al—GaZnO), IGZO (In—GaZnO), ZnO, IrOx, RuOx, NiO, RuOx/ITO, Ni/IrOx/Au, Ni/IrOx/Au/ITO, Ag, Ni, Cr, Ti, Al, Rh, Pd, Ir, Ru, Mg, Zn, Pt, Au, and Hf, but the embodiment is not limited thereto.

In addition, the first and second ohmic layers 132 and 134 can be formed by using different materials.

The embodiment provides the method for forming the ohmic layer in-situ based on difference in binding energy. That is, a boundary surface is formed due to the difference in binding energy between the first and second ohmic layers, so that the photonic crystalline pattern can be formed in the second ohmic layer and a light extraction pattern can be formed in the light emitting device having the quantum dot structure.

Although the embodiment may provide the ohmic layer in-situ, the ohmic layer is divided into an ohmic layer and a light extraction pattern layer in terms of functional aspect due to the difference in binding energy.

According to the related art, the light extraction pattern is formed on the ohmic layer through the etching process or the lift-off process. At this time, the surface of the ohmic layer may be damaged during the etching process, and impurities is infiltrated into the ohmic layer during the lift-off process, so that the ohmic characteristic may be lowered and the current leakage may be increased. For this reason, according to the embodiment, the ohmic layer is functionally divided into the ohmic layer and the light extraction pattern layer.

A thin film including material different from that of the ohmic layer can be provided to form the light extraction pattern without causing the damage to the ohmic layer. However, the thin film may increase resistance between the light emitting structure and the electrode, so that the operational voltage may be increased.

Therefore, according to the embodiment, the ohmic layer and the light extraction pattern layer are formed in-situ by using the same material. At this time, the ohmic layer may have a function different from that of the light extraction pattern layer by varying pressure when the ohmic layer and the light extraction pattern layer are formed. Thus, the etching behavior of the ohmic layer may be different from that of the light extraction pattern layer due to the difference in binding energy between the ohmic layer and the light extraction pattern layer. Accordingly, when the light extraction pattern is formed on the second ohmic layer, the boundary surface between the first and second ohmic layers may serve as an etch stop layer.

According to the light emitting device of the embodiment, the light extraction pattern can be formed on the second ohmic layer by using the difference in binding energy without degrading the ohmic characteristic.

According to the embodiment, the light extraction pattern is formed on the ohmic layer so that the failure factors, such as current leakage and increase of the driving voltage, can be removed.

That is, the ohmic layers are divided into the ohmic layer and the light extraction pattern layer so that the ohmic layer can be prevented from being damaged during the etching process, stable driving voltage can be achieved, and current leakage can be prevented.

In addition, since the boundary surface can be formed due to the difference in binding energy, the depth of the light extraction pattern layer can be adjusted when forming the ohmic layer. In addition, the boundary surface, which is formed between the first and second ohmic layer due to the difference in binding energy, may serve as the etch stop layer, so that the failure factors can be removed when forming the light extraction pattern.

Hereinafter, the method for manufacturing the light emitting device according to the first embodiment will be described with reference to FIGS. 2 to 5.

According to the embodiment, the light emitting device may include GaN, GaAs, GaAsP, or GaP. For instance, green-blue LEDs may include GaN (InGaN) and yellow-red LEDs may include InGaAlP or AlGaAs. In addition, full color can be realized by adjusting the composition of the above material.

Figure 2:
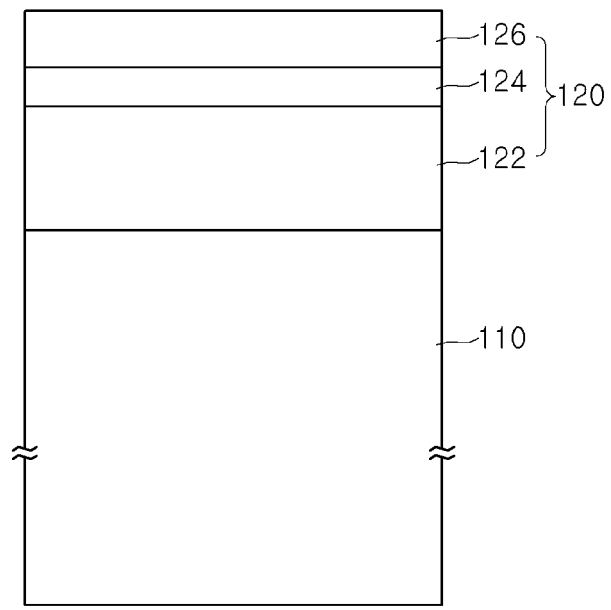
FIGS. 2 to 5 are sectional views showing the method for manufacturing a light emitting device according to the first embodiment.

First, the substrate 110 as shown in FIG. 2 is prepared. The substrate 110 includes a conductive substrate or an insulating substrate. For instance, the substrate 110 may include at least one of $Al_2O_3$, SiC, Si, GaAs, GaN, ZnO, Si, GaP, InP, Ge, and $Ga_2O_3$. A concave-convex structure can be formed on the substrate 110, but the embodiment is not limited thereto. The substrate 110 can be subject to the wet cleaning to remove impurities from the surface of the substrate 110.

Then, the light emitting structure 120 including the first conductive semiconductor layer 122, the active layer 124 and the second semiconductor layer 126 is formed on the substrate 110.

For instance, the light emitting structure 120 can be formed through MOCVD (Metal Organic Chemical Vapor Deposition), CVD (Chemical Vapor Deposition), PECVD (Plasma-Enhanced Chemical Vapor Deposition), MBE (Molecular Beam Epitaxy), or HVPE (Hydride Vapor Phase Epitaxy), but the embodiment is not limited thereto.

A buffer layer (not shown) can be formed on the substrate 110. The buffer layer may attenuate lattice mismatch between the light emitting structure 120 and the substrate 120. The buffer layer may include the group III-V compound semiconductor. For instance, the buffer layer may include at least one of GaN, InN, AlN, InGaN, AlGaN, InAlGaN, and AlInN. An undoped semiconductor layer can be formed on the buffer layer, but the embodiment is not limited thereto.

The first conductive semiconductor layer 122 may include a group III-V compound semiconductor doped with a first conductive dopant. If the first conductive semiconductor layer 122 is an N type semiconductor layer, the first conductive dopant is an N type dopant, such as Si, Ge, Sn, Se, or Te, but the embodiment is not limited thereto.

The first conductive semiconductor layer 122 may include semiconductor material having the compositional formula of $In_xAl_yGa_{1-x-y}N$ ($0 \leq x \leq 1$, $0 \leq y \leq 1$, $0 \leq x+y \leq 1$).

In addition, the first conductive semiconductor layer 122 may include at least one of GaN, InN, AlN, InGaN, AlGaN, InAlGaN, AlInN, AlGaAs, InGaAs, AlInGaAs, GaP, AlGaP, InGaP, AlInGaP, and InP.

The first conductive semiconductor layer 122 may include an N type GaN layer, which is formed through the CVD, MBE, sputtering or HVPE. In addition, the first conductive semiconductor layer 122 can be formed by injecting trimethyl gallium (TMGa) gas, ammonia ($NH_3$) gas, nitrogen ($N_2$) gas and silane ($SiH_4$) gas including n type impurities, such as silicon, into the chamber.

Electrons injected through the first conductive semiconductor layer 122 meet holes injected through the second conductive semiconductor layer 126 at the active layer 124, so that the active layer 124 can emit the light having energy determined based on the intrinsic energy band of the active layer (light emitting layer) 124.

The active layer 124 may include at least one of a single quantum well structure, a multiple quantum well (MQW) structure, a quantum wire structure and a quantum dot structure. For instance, the active layer 124 can be formed with the MQW structure by injecting TMGa gas, $NH_3$ gas, $N_2$ gas, and trimethyl indium (TMIn) gas, but the embodiment is not limited thereto.

The active layer 124 may have a well/barrier layer including at least one of InGaN/GaN, InGaN/InGaN, AlGaN/GaN, InAlGaN/GaN, GaAs/AlGaAs (InGaAs) and GaP/AlGaP (InGaP), but the embodiment is not limited thereto. The well layer may include material having the band gap energy lower than that of the barrier layer.

A conductive clad layer can be formed on and/or under the active layer 124. The conductive clad layer may include an AlGaN-based semiconductor having the band gap energy higher than that of the active layer 124.

The second conductive semiconductor layer 126 includes the group III-V compound semiconductor doped with the second conductive dopant. For instance, the second conductive semiconductor layer 126 may include the semiconductor material having the compositional formula of $In_xAl_yGa_{1-x-y}N$ ($0 \leq x \leq 1$, $0 \leq y \leq 1$, $0 \leq x+y \leq 1$). In detail, the second conductive semiconductor layer 126 may include one selected from the group consisting of GaN, AlN, AlGaN, InGaN, InN, InAlGaN, AlInN, AlGaAs, GaP, GaAs, GaAsP, and AlGaInP. If the second conductive semiconductor layer 126 is a P type semiconductor layer, the second conductive dopant includes the P type dopant such as Mg, Zn, Ca, Sr, or Ba. The second conductive semiconductor layer 126 can be prepared as a single layer or a multiple layer, but the embodiment is not limited thereto.

The second conductive semiconductor layer 126 may include a p type GaN layer, which can be formed by injecting TMGa gas, $NH_3$ gas, $N_2$ gas and (EtCp$_2$Mg) {Mg($C_2H_5C_5H_4$)$_2$} gas including p type impurities (for example, Mg) into the chamber, but the embodiment is not limited thereto.

According to the embodiment, the first conductive semiconductor layer 122 may include an N type semiconductor layer and the second conductive semiconductor layer 126 may include a P type semiconductor layer, but the embodiment is not limited thereto. In addition, a semiconductor layer, such as an N type semiconductor layer (not shown) having polarity opposite to that of the second conductive semiconductor layer 126, can be formed on the second conductive semiconductor layer 126. Thus, the light emitting structure 120 may include one of an N—P junction structure, a P—N junction structure, an N—P—N junction structure, and a P—N—P junction structure.

Figure 3:
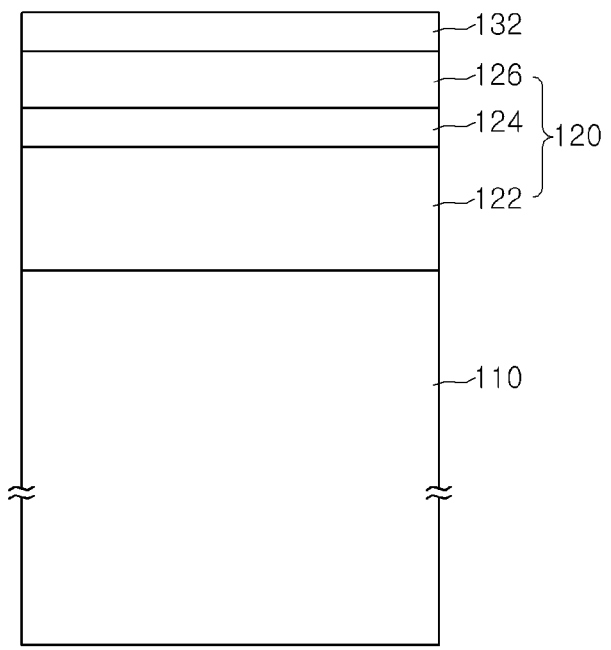

After that, as shown in FIG. 3, the first ohmic layer 132 is formed on the light emitting structure 120. For instance, the first ohmic layer 132 can be formed on the second conductive semiconductor layer 126, but the embodiment is not limited thereto. According to the second embodiment, the first ohmic layer is formed on the first conductive semiconductor layer.

The first ohmic layer 132 can be prepared as a stack structure including metal, a metal alloy and metal oxide that satisfy the work function of $\Phi_m > \Phi_s$.

For instance, when the first ohmic layer 132 is formed on the P type semiconductor layer, the ohmic layer 132 may satisfy the work function of $\Phi_m > \Phi_s$. However, if the first ohmic layer 132 is formed on the N type semiconductor layer as disclose in the second embodiment, the ohmic layer 132 may satisfy the work function of $\Phi_m < \Phi_s$.

In addition, the first ohmic layer 132 may include at least one selected from the group consisting of ITO (indium tin oxide), IZO (indium zinc oxide), IZTO (indium zinc tin oxide), IAZO (indium aluminum zinc oxide), IGZO (indium gallium zinc oxide), IGTO (indium gallium tin oxide), AZO (aluminum zinc oxide), ATO (antimony tin oxide), GZO (gallium zinc oxide), IZON (IZO nitride), AGZO (Al—GaZnO), IGZO (In—GaZnO), ZnO, IrOx, RuOx, NiO, RuOx/ITO, Ni/IrOx/Au, Ni/IrOx/Au/ITO, Ag, Ni, Cr, Ti, Al, Rh, Pd, Ir, Ru, Mg, Zn, Pt, Au, and Hf, but the embodiment is not limited thereto.

Figure 4:
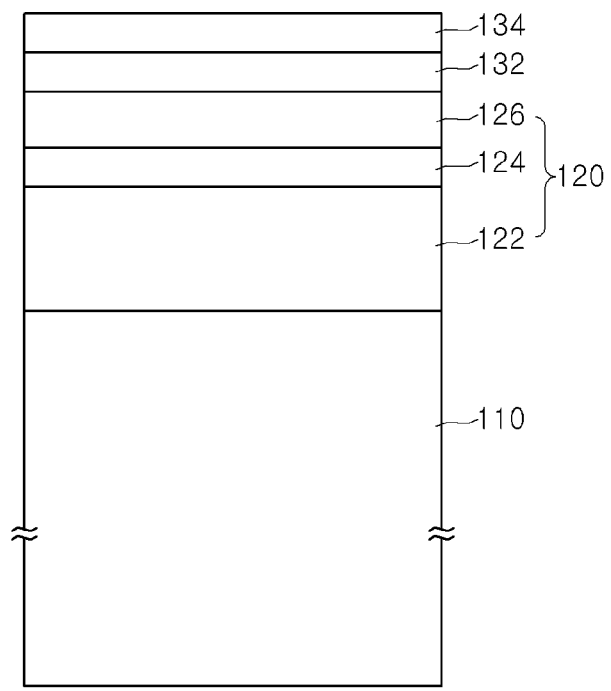

Then, as shown in FIG. 4, the second ohmic layer 134 is formed on the first ohmic layer 132.

The second ohmic layer 134 can be formed in-situ when the first ohmic layer 132 is formed.

The second ohmic layer 134 may be formed under pressure lower than pressure used for forming the first ohmic layer 132.

Thus, the second ohmic layer 134 may have density lower than that of the first ohmic layer 132. Thus, binding energy between materials of the second ohmic layer 134 may be lower than binding energy between materials of the first ohmic layer 132.

According to the embodiment, crystalline property of the second ohmic layer 134 may be relatively lower than that of the first ohmic layer 132. For instance, the second ohmic layer 134 and the first ohmic layer 132 may have an amorphous structure, a polycrystalline structure or a single crystalline structure, but the embodiment is not limited thereto.

The first and second ohmic layers 132 and 134 can be formed by using the same material. For instance, the second ohmic layer 134 includes at least one of an oxide layer, a nitride layer and a metal layer that satisfy the work function of $\Phi_m > \Phi_s$, but the embodiment is not limited thereto.

In addition, the first and second ohmic layers 132 and 134 can be formed by using the different materials.

According to the embodiment, in order to form the boundary surface based on the difference in binding energy between the first and second ohmic layers 132 and 134, the first and second ohmic layers 132 and 134 are formed in-situ while varying oxygen partial pressure, source power, and gas time. Thus, the first and second ohmic layers 132 and 134 may have different physical properties even though they are formed by using the same material, so that interlayer stress can be removed.

Such a binding energy exchange surface varies the etching behavior between upper and lower layers on the basis of the boundary surface, so that the ohmic layer and the light extraction pattern layer may have different functions.

According to the embodiment, when the second ohmic layer 134 is formed, inert gas is injected while varying the oxygen partial pressure by ten times or more for a predetermined period of time after forming the first ohmic layer 132. Thus, the internal plasma behavior is changed, so that the surface property is changed.

Since the binding energy has been changed at the boundary surface, thin films formed after the boundary surface has low film density, so the thin films may have different physical properties.

Figure 5:
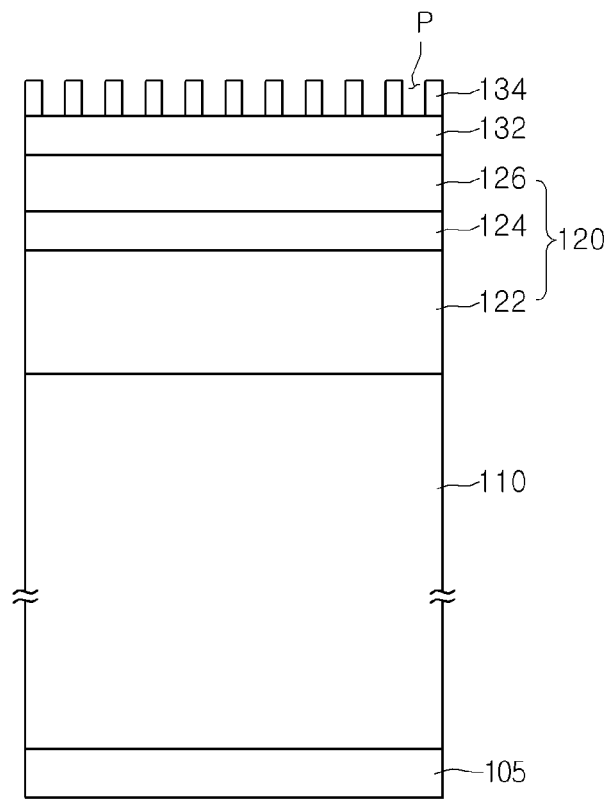

Then, as shown in FIG. 5, the pattern P is formed on the second ohmic layer 134. The pattern P may include a photonic crystalline pattern, but the embodiment is not limited thereto. For instance, the pattern P may include a concave-convex pattern.

For instance, the pattern P is formed by partially etching the second ohmic layer 134, and the boundary surface between the first and second ohmic layers 132 and 134 may serve as an etch stop layer.

According to the embodiment, the pattern P has a periodic two-dimensional structure, such as a triangular lattice structure, a rectangular lattice structure, an Archimedean lattice structure or a quasi-crystal structure. In addition, the pattern P may have an irregular random pattern in addition to the periodic pattern.

According to the embodiment, the pattern P may include holes connected to each other for current diffusion.

The period of the pattern H according to the embodiment is about 100 nm to about 5000 nm and the filling factor, which is defined as an area ratio of the second ohmic layer 134 including the pattern P relative to the area of the top surface of the LED chip, is about 5% to about 95%.

According to the embodiment, the pattern P can be filled with at least one of air, epoxy and dielectric substance. If the pattern P is filled with the dielectric substance, the dielectric substance may have a refractive index higher than 1 and lower than 3. If the pattern P is filled with the air, a resist layer or insulating material is formed on the pattern area and additional material is formed on the second ohmic layer 134. Then, the resist layer or insulating material is selectively removed.

After that, a second electrode (not shown) is formed on the second ohmic layer 134 and a reflective layer 105 is formed under the substrate 110.

According to the embodiment, the reflective layer 105 reflects the light incident from the light emitting structure 120, thereby improving the light extraction efficiency.

For instance, the reflective layer 105 may include metal or a metal alloy including at least one selected from the group consisting of Ag, Ni, Al, Rh, Pd, Ir, Ru, Mg, Zn, Pt, Au, and Hf. In addition, the reflective layer 105 can be prepared as a multiple layer by using the above metal or metal alloy and transmissive conductive material, such as IZO, IZTO, IAZO, IGZO, IGTO, AZO, or ATO. For instance, the reflective layer 105 may have the stack structure including IZO/Ni, AZO/Ag, IZO/Ag/Ni, or AZO/Ag/Ni.

According to the light emitting device of the embodiment, the light extraction pattern can be formed on the ohmic layer by using the difference in binding energy without degrading the ohmic characteristic.

According to the embodiment, the light extraction pattern is formed on the ohmic layer so that the failure factors, such as current leakage and increase of the driving voltage, can be removed.

Figure 6:
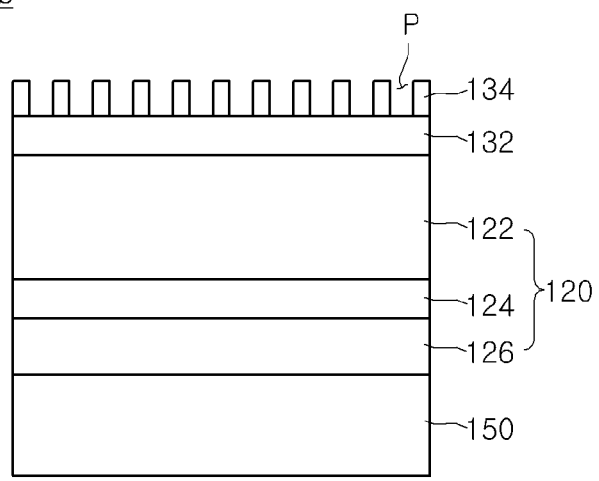
FIG. 6 is a sectional view showing a light emitting device according to the second embodiment.

FIG. 6 is a sectional view showing a light emitting device 100b according to the second embodiment.

The vertical type light emitting device is employed in the second embodiment. The second embodiment may adopt the technical features of the first embodiment and the following description will be focused on difference with respect to the first embodiment.

The light emitting device according to the second embodiment includes the second electrode 150 under the light emitting structure 120. The second electrode 150 may include at least one of an ohmic layer (not shown), a reflective layer (not shown), a bonding layer (not shown), and a conductive substrate (not shown).

The second electrode 150 may be adjacent to the second conductive semiconductor layer 126, but the embodiment is not limited thereto.

The light emitting structure 120 is formed on a nonconductive substrate (not shown), the second electrode 150 is formed on the light emitting structure 120, and then the nonconductive substrate is removed. According to another embodiment, the light emitting structure 120 can be grown on the nonconductive substrate.

According to the second embodiment, the first ohmic layer 132 can be formed on the first conductive semiconductor layer 122, but the embodiment is not limited thereto.

According to the light emitting device of the embodiment, the light extraction pattern can be formed on the ohmic layer by using the binding energy without degrading the ohmic characteristic.

Figure 7:
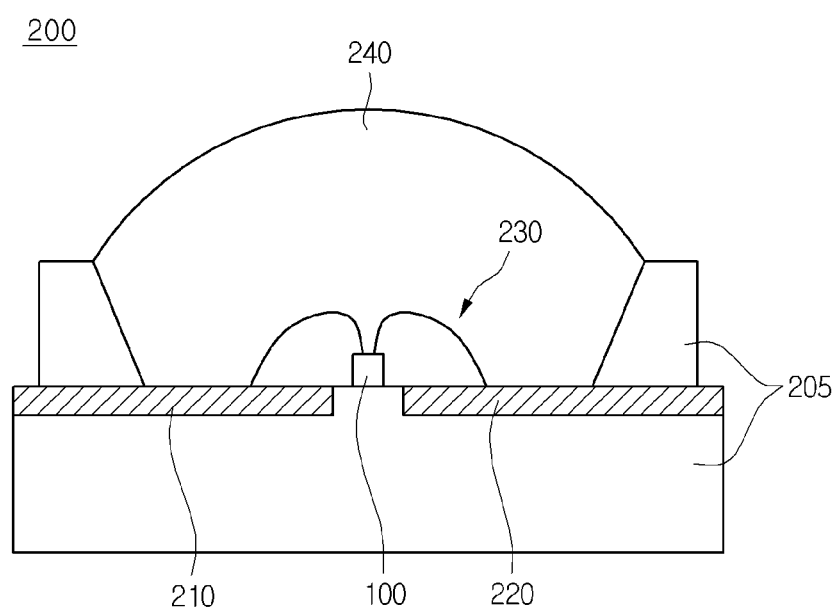
FIG. 7 is a sectional view showing a light emitting device package according to the embodiment.

FIG. 7 is a view showing a light emitting device package 200 including the light emitting device according to the embodiments.

Referring to FIG. 7, the light emitting device package 200 includes a package body 205, third and fourth electrode layers 213 and 214 formed on the package body 205, the light emitting device 100 provided on the package body 205 and electrically connected to the third and fourth electrode layers 213 and 214 and a molding member 240 that surrounds the light emitting device 100.

The package body 205 may include silicon, synthetic resin or metallic material. An inclined surface may be formed around the light emitting device 100.

The third and fourth electrode layers 213 and 214 are electrically isolated from each other to supply power to the light emitting device 100. In addition, the third and fourth electrode layers 213 and 214 reflect the light emitted from the light emitting device 100 to improve the light efficiency and dissipate heat generated from the light emitting device 100 to the outside.

The lateral type light emitting device shown in FIG. 1 can be employed as the light emitting device 100, but the embodiment is not limited thereto. For instance, the vertical type light emitting device as shown in FIG. 6 can be used as the light emitting device 100.

The light emitting device 100 can be installed on the package body 205 or the third and fourth electrode layers 213 and 214.

The light emitting device 100 is electrically connected to the third electrode layer 213 and/or the fourth electrode layer 214 through at least one of a wire bonding scheme, a flip chip bonding scheme and a die bonding scheme. According to the embodiment, the light emitting device 100 is electrically connected to the third electrode layer 213 through a wire 230 and electrically connected to the fourth electrode layer 214 through the die bonding scheme, but the embodiment is not limited thereto.

The molding member 240 surrounds the light emitting device 100 to protect the light emitting device 100. In addition, the molding member 240 may include phosphors to change the wavelength of the light emitted from the light emitting device 100.

A plurality of light emitting device packages according to the embodiment may be arrayed on a substrate, and an optical member including a light guide plate, a prism sheet, a diffusion sheet or a fluorescent sheet may be provided on the optical path of the light emitted from the light emitting device package. The light emitting device package, the substrate, and the optical member may serve as a backlight unit or a lighting unit. For instance, the lighting system may include a backlight unit, a lighting unit, an indicator, a lamp or a streetlamp.

Figure 8:
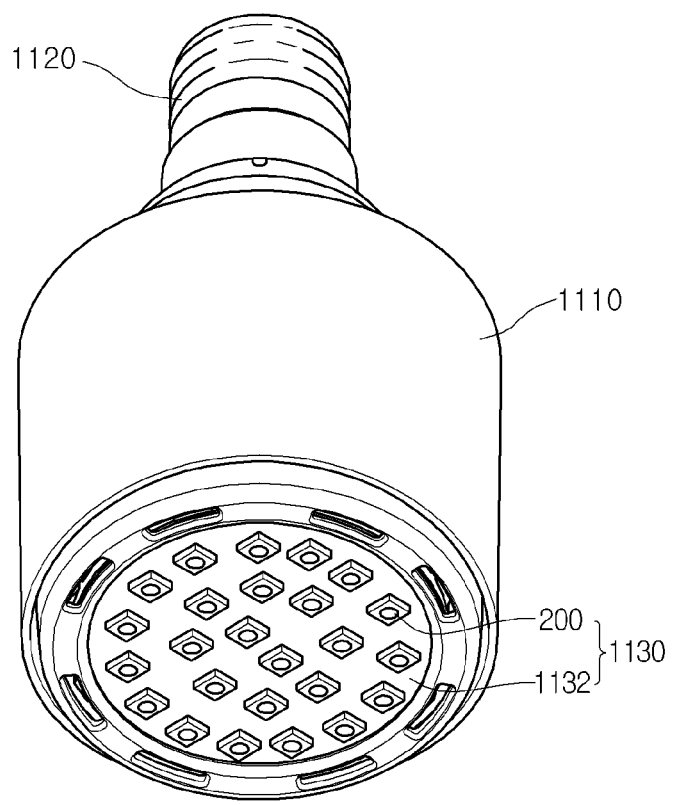
FIG. 8 is a perspective view showing a lighting unit according to the embodiment.

FIG. 8 is a perspective view showing a lighting unit 1100 according to the embodiment. The lighting unit 1100 shown in FIG. 8 is an example of a lighting system and the embodiment is not limited thereto.

Referring to FIG. 8, the lighting unit 1100 includes a case body 1110, a light emitting module 1130 installed in the case body 1110, and a connection terminal 1120 installed in the case body 1110 to receive power from an external power source.

Preferably, the case body 1110 includes material having superior heat dissipation property. For instance, the case body 1110 includes metallic material or resin material.

The light emitting module 1130 may include a substrate 1132 and at least one light emitting device package 200 installed on the substrate 1132.

The substrate 1132 includes an insulating member printed with a circuit pattern. For instance, the substrate 1132 includes a PCB (printed circuit board), an MC (metal core) PCB, an F (flexible) PCB, or a ceramic PCB.

In addition, the substrate 1132 may include material that effectively reflects the light. The surface of the substrate 1132 can be coated with a color, such as a white color or a silver color, to effectively reflect the light.

At least one light emitting device package 200 can be installed on the substrate 1132. Each light emitting device package 200 may include at least one LED (light emitting diode). The LED may include a colored LED that emits the light having the color of red, green, blue or white and a UV (ultraviolet) LED that emits UV light.

The LEDs of the light emitting module 1130 can be variously arranged to provide various colors and brightness. For instance, the white LED, the red LED and the green LED can be arranged to achieve the high color rendering index (CRI).

The connection terminal 1120 is electrically connected to the light emitting module 1130 to supply power to the light emitting module 1130. Referring to FIG. 8, the connection terminal 1120 has a shape of a socket screw-coupled with the external power source, but the embodiment is not limited thereto. For instance, the connection terminal 1120 can be prepared in the form of a pin inserted into the external power source or connected to the external power source through a wire.

Figure 9:
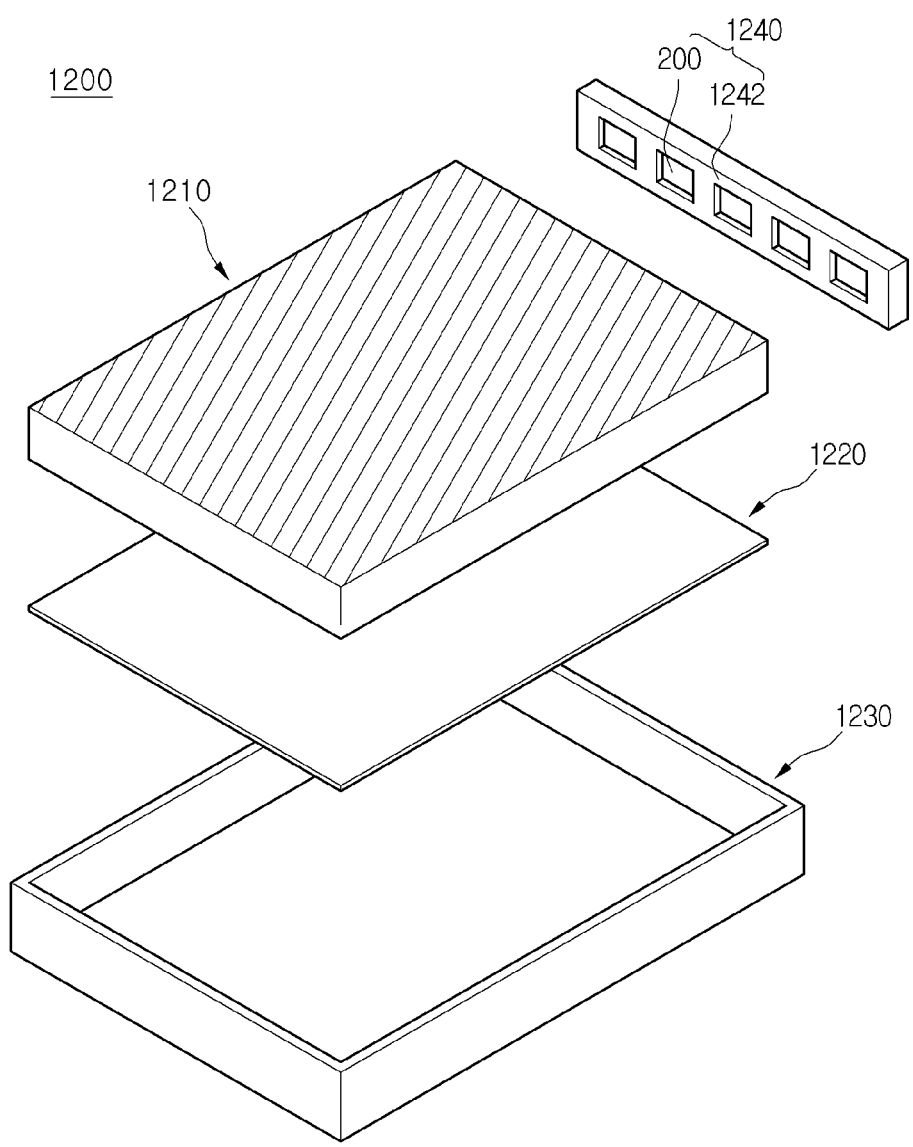
FIG. 9 is an exploded perspective view showing a backlight unit according to the embodiment.

FIG. 9 is an exploded perspective view showing a backlight unit 1200 according to the embodiment. The backlight unit 1200 shown in FIG. 9 is an example of a lighting system and the embodiment is not limited thereto.

The backlight unit 1200 according to the embodiment includes a light guide plate 1210, a light emitting module 1240 for providing the light to the light guide plate 1210, a reflective member 1220 positioned below the light guide plate 2110, and a bottom cover 1230 for receiving the light guide plate 1210, light emitting module 1240, and the reflective member 1220 therein, but the embodiment is not limited thereto.

The light guide plate 1210 diffuses the light to provide surface light. The light guide 1210 includes transparent material. For instance, the light guide plate 1210 can be manufactured by using acryl-based resin, such as PMMA (polymethyl methacrylate), PET (polyethylene terephthalate), PC (polycarbonate), COC or PEN (polyethylene naphthalate) resin.

The light emitting module 1240 supplies the light to at least one lateral side of the light guide plate 1210 and serves as the light source of the display device including the backlight unit.

The light emitting module 1240 can be positioned adjacent to the light guide plate 1210, but the embodiment is not limited thereto. In detail, the light emitting module 1240 includes a substrate 1242 and a plurality of light emitting device packages 200 installed on the substrate 1242 and the substrate 1242 can be adjacent to the light guide plate 1210, but the embodiment is not limited thereto.

The substrate 1242 may include a printed circuit board (PCB) having a circuit pattern (not shown). In addition, the substrate 1242 may also include a metal core PCB (MCPCB) or a flexible PCB (FPCB), but the embodiment is not limited thereto.

In addition, the light emitting device packages 200 are arranged such that light exit surfaces of the light emitting device packages 200 are spaced apart from the light guide plate 1210 by a predetermined distance.

The reflective member 1220 is disposed below the light guide plate 1210. The reflective member 1220 reflects the light, which is travelled downward through the bottom surface of the light guide plate 1210, toward the light guide plate 1210, thereby improving the brightness of the backlight unit. For instance, the reflective member 1220 may include PET, PC or PVC resin, but the embodiment is not limited thereto.

The bottom cover 1230 may receive the light guide plate 1210, the light emitting module 1240, and the reflective member 1220 therein. To this end, the bottom cover 1230 has a box shape with an open top surface, but the embodiment is not limited thereto.

The bottom cover 1230 can be manufactured through a press process or an extrusion process by using metallic material or resin material.

As described above, the lighting system according to the embodiment includes the light emitting device package, so that the reliability of the lighting system can be improved.

Any reference in this specification to "one embodiment," "an embodiment," "example embodiment," etc., means that a particular feature, structure, or characteristic described in connection with the embodiment is included in at least one embodiment of the invention. The appearances of such phrases in various places in the specification are not necessarily all referring to the same embodiment. Further, when a particular feature, structure, or characteristic is described in connection with any embodiment, it is submitted that it is within the purview of one skilled in the art to effect such feature, structure, or characteristic in connection with other ones of the embodiments.

Although embodiments have been described with reference to a number of illustrative embodiments thereof, it should be understood that numerous other modifications and embodiments can be devised by those skilled in the art that will fall within the spirit and scope of the principles of this disclosure. More particularly, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

The invention claimed is:

1. A light emitting device comprising:
 a light emitting structure including a first conductive semiconductor layer, a second conductive semiconductor layer, and an active layer between the first and second conductive semiconductor layers;
 a first ohmic layer physically contacted with an upper surface of light emitting structure; and
 a second ohmic layer including a light extraction pattern having holes and physically contacted with an upper surface of the first ohmic layer,
 wherein the second ohmic layer is formed of a material identical to a material of the first ohmic layer,
 wherein a chemical binding energy between materials constituting of the second ohmic layer is lower than a chemical binding energy between materials constituting of the first ohmic layer,
 wherein a boundary surface disposed between the first and second ohmic layers is formed by a difference between the chemical binding energies and is a surface adjusting a depth of the light extraction pattern by the difference of the chemical binding energies,
 wherein the second ohmic layer including the light extraction pattern is located at a higher position than that of the upper surface of the first ohmic layer and the boundary surface,
 wherein the second ohmic layer including the light extraction pattern is not contacted with the upper surface of the second conductive semiconductor layer,
 wherein each of the plurality of holes of the second ohmic lager has a depth the same as a thickness of the second ohmic layer,
 wherein the depth of the light extraction pattern is the depth of the each of the plurality of holes, and
 wherein the second ohmic layer directly contacts a first electrode,
 wherein the first and second ohmic layers formed of an oxide layer, and
 wherein the oxide layer does not contain a nitride.

2. The light emitting device as claimed in claim 1, wherein the first and second ohmic layers comprise at least one of ITO, IZO (In—ZnO), GZO (Ga—ZnO), AZO (Al—ZnO), AGZO (Al—GaZnO), IGZO (In—GaZnO), IrOx, and RuOx.

3. The light emitting device as claimed in claim 1, wherein the light emitting structure is formed on a nonconductive substrate and the first ohmic layer is physically contacted with an upper surface of the second conductive semiconductor layer.

4. The light emitting device as claimed in claim 1, further comprising a second electrode physically contacted with a lower surface of the second conductive semiconductor layer, wherein the first ohmic layer is physically contacted with an upper surface of the first conductive semiconductor layer.

5. The light emitting device as claimed in claim 4, wherein the second electrode includes a reflective layer.

6. The light emitting device as claimed in claim 1, wherein the light extraction pattern includes at least one of a photonic crystalline pattern and a concave-convex pattern.

7. The light emitting device as claimed in claim 1, wherein the first and second ohmic layers are formed of a metal layer.

8. The light emitting device as claimed in claim 1, wherein the light extraction pattern is filled with a dielectric substance.

9. The light emitting device as claimed in claim 1, wherein the light extraction pattern is filled with air.

10. The light emitting device as claimed in claim 1, wherein the first conductive semiconductor layer is physically contacted with the first ohmic layer and is formed of a p-type semiconductor layer.

11. The light emitting device as claimed in claim 1, wherein the first conductive semiconductor layer is physically contacted with the first ohmic layer and is formed of an n-type semiconductor layer.

12. The light emitting device as claimed in claim 1, wherein a ratio of the area of the second ohmic layer including the light extraction pattern relative to an area of a top surface of the light emitting device is about 5% to 95%.

13. The light emitting device as claimed in claim 1, wherein the second ohmic layer has a density lower than that of the first ohmic layer.

* * * * *